United States Patent
Boutin et al.

(10) Patent No.: US 6,212,072 B1
(45) Date of Patent: Apr. 3, 2001

(54) ELECTRONICS PACKAGE ON A PLATE, AND A METHOD OF MAKING SUCH A PACKAGE

(75) Inventors: Xavier Boutin, Le Chesnay; Alain Dreyfus, Osny; Jean Hoche, Saint Etienne du Rouvray; Alain Prolonge, Courdimanche, all of (FR)

(73) Assignee: Sagem SA, Paris (FR)

( * ) Notice: Subject to any disclaimer, the term of this patent is extended or adjusted under 35 U.S.C. 154(b) by 0 days.

(21) Appl. No.: 09/572,933

(22) Filed: May 18, 2000

(30) Foreign Application Priority Data

May 19, 1999 (FR) .................................................. 99 06343

(51) Int. Cl.[7] ..................................................... H05K 7/20
(52) U.S. Cl. ......................... 361/704; 361/761; 257/712; 174/261
(58) Field of Search ..................................... 361/700–712, 361/757, 760, 761, 762, 767; 257/697, 700, 712; 29/837, 840, 846, 848; 174/250, 257, 260–262, 255, 259; 166/248, 252.1; 216/44, 100; 427/448; 430/314; 205/118, 131

(56) References Cited

U.S. PATENT DOCUMENTS

| 3,903,590 | 9/1975 | Yokogawa | 29/577 |
| 4,363,930 | 12/1982 | Hoffman | 174/68.5 |
| 4,374,457 | 2/1983 | Wiech | 29/591 |
| 4,446,477 | 5/1984 | Currie et al. | 357/74 |
| 4,519,877 | 5/1985 | Wiech | 204/15 |
| 4,532,152 | 7/1985 | Elarde | 427/96 |
| 4,546,065 | 10/1985 | Amendola et al. | 430/313 |
| 4,552,615 | 11/1985 | Amendola et al. | 158/659.1 |
| 4,604,678 | 8/1986 | Hagner | 361/401 |
| 4,775,611 | 10/1988 | Sullivan | 430/319 |
| 4,912,844 | 4/1990 | Parker | 29/848 |
| 4,985,601 | 1/1991 | Hagner | 174/261 |
| 5,369,881 | 12/1994 | Inaba et al. | 29/846 |
| 5,531,020 | 7/1996 | Durand et al. | 29/840 |

FOREIGN PATENT DOCUMENTS

| 3910699 | 10/1990 | (DE) . | |
| 0272390 | 6/1988 | (EP) . | |
| 0746022 | 12/1996 | (EP) . | |
| 363287047 | 11/1988 | (JP) | H01L/23/50 |
| 401067945 | 3/1989 | (JP) | H01L/21/94 |
| 407201718 | 8/1995 | (JP) | H01L/21/027 |

*Primary Examiner*—Leo P. Picard
*Assistant Examiner*—Michael Datskovsky
(74) *Attorney, Agent, or Firm*—Larson & Taylor, PLC

(57) ABSTRACT

An electronic package has a plate of aluminum or aluminum alloy supporting electronic microcomponents. Trenches, and possibly cavities, are formed on a major surface of the plate. An insulating oxide layer covers the major surface, including the trenches and cavities. A network of equipotential electrically conductive connection tracks are formed on the major surfaces and receive contacts of the electronic microcomponents. Some tracks are above the trenches and thicker than the others.

9 Claims, 2 Drawing Sheets

ELECTRONICS PACKAGE ON A PLATE, AND A METHOD OF MAKING SUCH A PACKAGE

BACKGROUND OF THE INVENTION

The present invention relates to an electronics package comprising a plate made of aluminum or of an aluminum alloy that constitutes a heat radiator. That plate has an insulating oxide layer on a major surface, and carries a network or pattern of equipotential connection tracks designed to receive electronic microcomponents.

A particularly important, although non-exclusive, application of the invention lies in the field of the automotive industry where it is desirable to have structures that are as simple as possible and where it is also often necessary to evacuate large amounts of heat power under conditions of relatively high temperature.

Methods are already known for anodizing aluminum that make it possible to obtain a surface layer of oxide on which it is then possible to form conductor tracks by silk-screen printing. An advantageous method for achieving this result is described in French patent application 97 06107 or EP-A-0 880 310.

SUMMARY OF THE INVENTION

It is an object of the present invention to provide an electronics package of the above-defined kind that is particularly adapted to situations where at least some of the tracks and microcomponents or "chips" carry high currents.

Consequently, according to an aspect of the invention, there is provided an electronics package comprising:

a plate of aluminum or aluminum alloy having trenches formed on a major surface thereof, an insulating oxide layer on at least the whole of said major surface of said plate, a network of equipotential electrically conductive connection tracks on said major surfaces arranged to receive electronic microcomponents, some at least of said tracks being above said trenches, and a plurality of electronic microcomponents having contacts electrically connected to some at least of said tracks.

When the equipotential connection tracks are conventionnally formed by a silk screen printing technique, those tracks which overlie the trenches present a certain amount of increased thickness and thus, for a given width, a greater cross-section since silk-screen inks are leveled off substantially uniformly prior to baking or curing. It suffices to make such trenches in register with those tracks which are to convey high current in order to ensure that the tracks are larger in cross-section. This makes it possible to reduce the width of tracks that carry high currents and thus the amount of space that such tracks occupy, thereby increasing circuit density.

The electronics package can include power circuits as well as control circuits. Because of the direct contact between the components and the aluminum plate constituting the substrate, heat transfer takes place via a path that presents low thermal resistance. The oxide layer can be very thin, providing the anodization techniques used avoid the appearance of cracks or pinholes. In practice, the thickness of the oxide layer will generally lie in the range 10 micrometers ($\mu$m) to 200 $\mu$m.

By placing components in cavities, the extent to which they project is reduced, thereby reducing the size of the package.

According to the invention there is also provided a method of fabricating an electronics package comprising the steps of:

making a plate of unalloyed or alloyed aluminum and forming trenches in a major surface thereof;

forming an oxide layer on the plate and trenches and forming a network of equipotential connecting tracks on the plate, with at least some of the tracks overlying trenches, if trenches are provided; and mounting electronic microcomponents on said oxidized major surface and soldering contacts of the microcomponents to the tracks. In a preferred embodiments at least some of the microcomponents are located in cavities or recesses provided in the plate and coated by said oxide layer. Such microcomponents may be connected to the tracks formed on the major surface by soldered wires.

The method is particularly advantageous for packages in which only some of the tracks and only some of the microcomponents carry high currents.

The current-carrying cross-section of the tracks can then be adapted to the current that they will carry, with a width which is the same for all tracks.

If those microcomponents which support power are placed in recesses with their contact tabs outside of the recesses, then heat transfer between such microcomponents and the plate is improved because they contact the plate over their entire surface area that is free from any electrical connection tabs.

It is thus easy to adapt the cross-section of the tracks as a function of the power they are to convey and/or to place the power circuits in such a manner that the heat they generate is evacuated under good conditions and that the space they occupy is small.

In practice, an aluminum plate that is only a few millimeters thick will often be used. The plate can have projections from its surface remote from the surface carrying the microcomponents (or at least most of the microcomponents). The trenches and/or the recesses can be several tenths of a millimeter deep.

Depending on the thickness of the aluminum plate, it can be fabricated by various different methods. Often it can be fabricated by casting. If the trenches and the cavities are shallow, they can be made merely by stamping. When the plate is thick and the cavities or recesses are deep, it may be necessary to machine the recesses.

In still another aspect of the present invention, there is provided an electronics package of the above-defined kind including a connector fixed directly to the plate, constituting a one-piece assembly therewith, and suitable for being implemented by a method of manufacture that is simple.

For this purpose, the invention uses the surface oxidation of the aluminum to form an insulating layer covering through-holes formed in the plate for receiving electrical connection pins.

Consequently, there is then provided an electronics package comprising:

a plate of aluminum or aluminum alloy, constituting a radiator, formed with an array of through holes, at least one major surface and the holes being covered with an oxide layer carrying a network of equipotential connection tracks on said major surface;

electronic microcomponents having contacts fixed to some of the tracks by soldering; and electrical connection pins passing through the plate, soldered to some at least of said tracks of the network and projecting from a major surface of said plate opposed to said one surface of the plate into a connector which is fixed to the plate and which is arranged to receive a mating connector.

The connector fixed to the plate can be sealed by an internal "potting" compound covering the pins. Since the connector is placed on the side remote from the major surface that receives the electronic microcomponents, it leaves said major surface completely free.

When the package comprises both power circuits and signal circuits, the pins of the connector will often be of different types. It is possible to incorporate them in a single connector or else in different connectors all of which are placed on the side remote from the face which carries the microcomponents.

There is still provided a method of fabricating an electronics package, comprising the steps of:

a plate is made of pure or alloyed aluminum, in which an array of through holes is formed;

the plate and the holes are covered in an oxide layer and a network of equipotential connection tracks is formed on the plate;

electronic microcomponents are mounted on said face and their outlets are fixed to the tracks by soldering; and electrical connection pins are mounted through the plate in the holes, the pins projecting through the opposite face of the plate, and the pins are connected to tracks of the network by soldering during the same step as fixes the microcomponents.

Because the pins are soldered to the tracks during the same soldering step as the step used for fixing the electronic microcomponents, the manufacturing method is simplified. Furthermore, the oxide layer covering the walls of the holes provides insulation between the pins. Consequently there is no longer any need to guarantee such insulation by injecting resin between the pins and the walls of the holes.

The above characteristics and others will appear more clearly on reading the following description of particular embodiments, given by way of non-limiting example. The description refers to the accompanying drawings.

DETAILED DESCRIPTION OF THE INVENTION

The following description relates essentially to single-sided circuits for which the plate is oxidized on both faces. Nevertheless, it is possible with conventional masking techniques to make double-sided circuits or to oxidize only that face of the plate which carries the microcomponents.

The starting material is a thin plate of unalloyed aluminum or of aluminum alloy with a low magnesium content. To increase its heat-dissipation capacity, the side of the plate which does not receive the microcomponents is advantageously provided with projections that increase its surface area. For automotive applications, the thickness of the plate will generally lie in the range 2 mm to 30 mm.

At locations that are to receive tracks of large cross-section in order to convey high currents, the plate 10 has trenches 36 formed therein to a depth of several tenths of a millimeter. In the illustrated embodiment recesses or cavities 38 are also formed to receive some (or all) of the microcomponents.

Figure 1A:
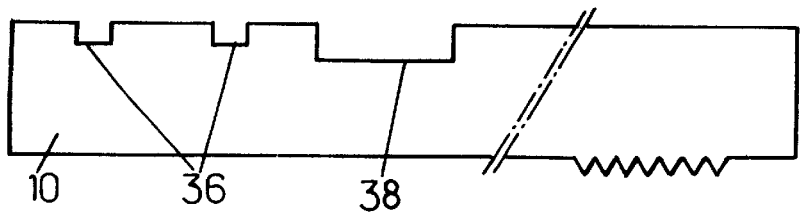
FIGS. 1A to 1C (which are not to scale for greater clarity) are diagrams showing successive steps in manufacturing a package constituting a particular embodiment of the invention.
Figure 1B:
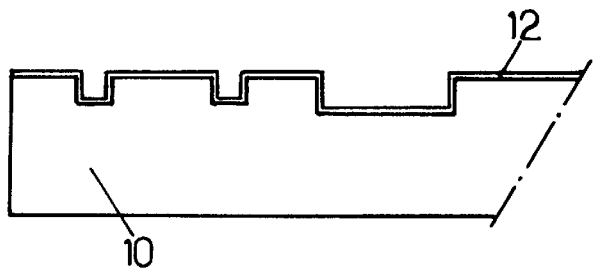

The plate 10 obtained in this way, as shown in FIG. 1A, is subjected to anodizing so as to obtain a surface oxide layer 12. This layer is advantageously 90 micrometers ($\mu$m) to 140 $\mu$m thick. It must be free from cracking so as to guarantee electrical insulation. For this purpose, it is possible, particularly but not exclusively, to use the method described in French patent application 97 06107 or document EP-A-0 880 310.

The oxidized plate is generally then cleaned so as to remove contamination, and the pores of the insulating film are plugged, e.g. by silicon oxide or by epoxy type resins. Various sol-gel methods can also be used.

Thereafter, the oxidized plate receives a network or pattern of equipotential conductive tracks. These tracks can be formed directly by silk-screen printing. A silk-screen ink can be used that is cured at low temperature so as to reduce thermal stresses. Nevertheless, it has been found possible to make use of inks that are cured at around 500° C., providing the oxide is formed in such a manner as to impart some amount of flexibility thereto.

In some cases, the tracks deposited on the oxide film are connected directly to the microcomponents. However, it is also possible to use a method that gives rise to two metal conductor layers. Under such circumstances, a dielectric layer is deposited on the conductor tracks and vias are provided. A new layer of connection tracks and areas is formed on the dielectric layer.

Figure 1C:
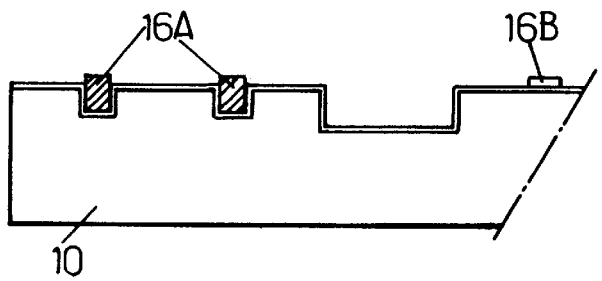
Figure 2:
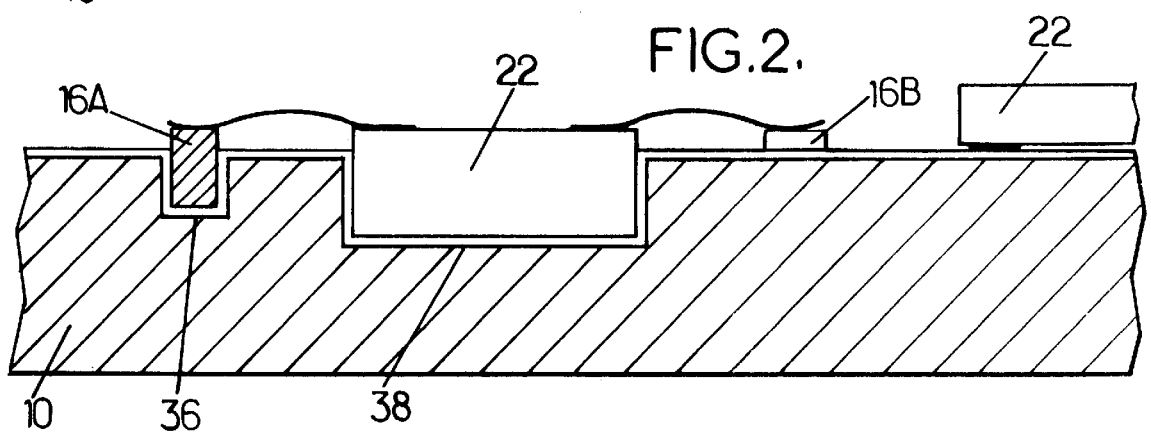
FIG. 2 shows a particular embodiment of the assembly in detail.
Figure 3:
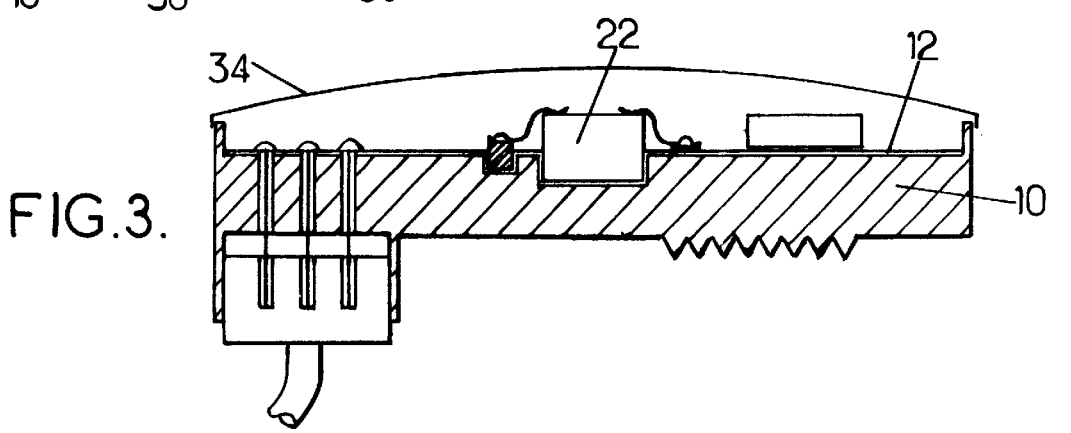
FIG. 3 is a diagram showing a complete package.

In the example shown in FIG. 1C, only one layer of metallization is provided. When the metal forming ink is put into place by silk-screen printing, the ink fills the trenches 36. After excess ink has been scraped off, there remains a thickness of ink overlying the bottoms of the trenches that is greater than the thickness overlying the flat portion of the plate. Consequently, the current-carrying section provided by the tracks 16A over the trenches is greater than that provided by the other tracks 16B.

The plate treated in this way is placed on a support. The microcomponents 22 are put into place and secured by soldering, generally using lead-tin solder.

The components 22 placed in recesses 38 can be mounted upside-down so that their contact-free faces rest against the bottoms of the recesses. This causes them to project by a smaller amount, and connections made by flexible wires and soldering to the tracks 16A and/or 16B are made shorter.

The assembly built up in this way can receive a protective cover 34 overlying the microcomponents, thereby isolating them from the environment.

In the embodiment of FIGS. 4A to 4E, the start material is likewise a thin plate of unalloyed aluminum or of aluminum alloy having low magnesium content. It is initially formed with an array of holes for receiving the pins of a connector which is placed onto the surface of the plate that is remote from the surface that receives the microcircuits.

Figure 4A:
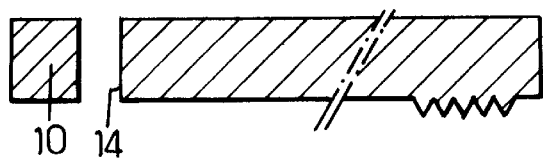
FIGS. 4A to 4E (which are not to scale for greater clarity) are diagrams showing successive steps in fabricating a package constituting another particular embodiment of the invention.
Figure 4B:
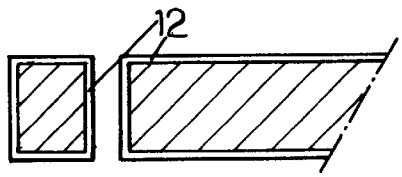

The plate 10 obtained in this way, of the kind shown in FIG. 4A where only one hole is shown, is subjected to anodizing which gives rise to the surface oxide layer 12. This layer must be free from any cracks so as to guarantee that the pins which are to be mounted in the holes 14 are electrically insulated.

Figure 4C:
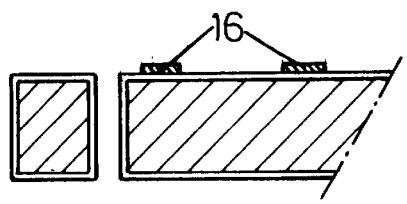

After being oxidized and then cleaned, the plate further receives a network of equipotential conductive tracks. These tracks 16 can typically be formed by silk-screen printing (FIG. 4C).

Figure 4D:
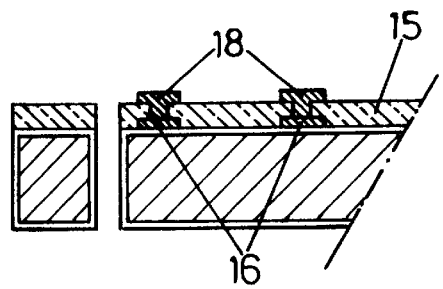
Figure 4E:
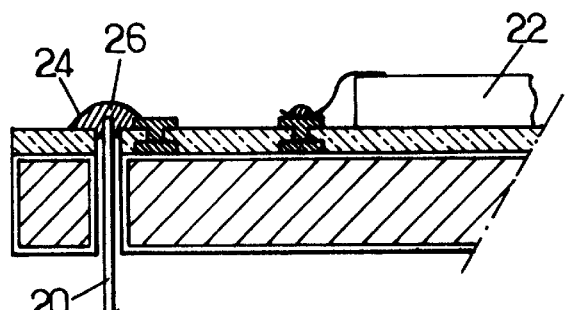

A method will now be described for obtaining two metal conductor layers. Under such circumstances, a dielectric layer 15 is deposited on the conductor tracks and vias are provided, including vias in register with the holes. A new layer having connection tracks and areas 18 is formed on the layer 15 (FIG. 4D).

The plate processed in this way is put on a support. The pins 20 are put into place and then the microcomponents 22. Both are then secured by soldering, generally using a lead-tin solder. The connector 24 into which the pins are to be fixed permanently can be put into place at this stage to hold the pins in their correct positions. Spots of solder cover the heads of the pins (FIG. 4E) and extend over the appropriate connection areas.

Figure 5:
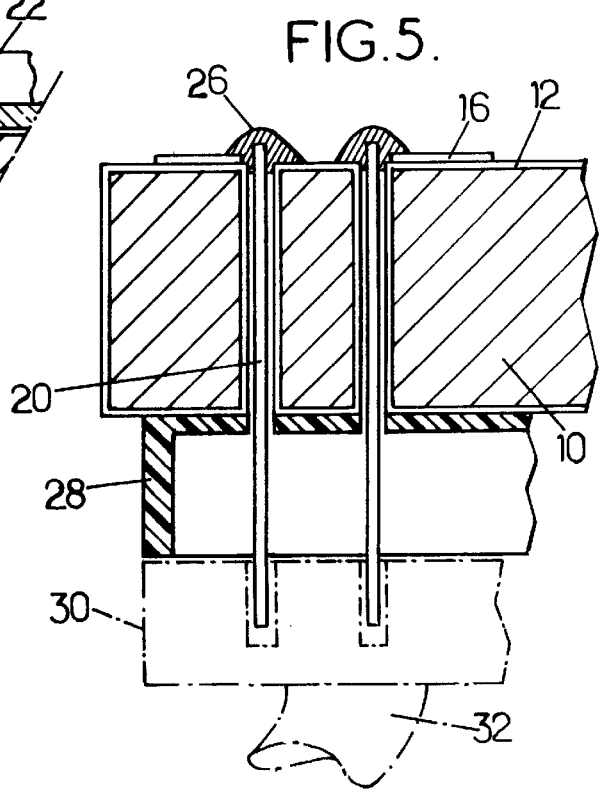
FIG. 5 is a diagram on an enlarged scale showing how a connector can be mounted.

In the example shown in FIG. 5, a single layer of metallization is provided and the pins are soldered directly to respective tracks 16. FIG. 5 also shows the connector 28 to which the pins are securely connected. The connections can be sealed by embedding the inside of the connector using a polymerizable resin which also holds the pins. The connector 28 is designed to receive a removable mating connector 30 connected to a flexible cable 32. The connector 28 contains female contacts for mating with the pins.

The assembly can also receive a protective cover 34. The potting of the connector, which can also enter the holes 14, separate the inside of the cover from the atmosphere.

We claim:

1. An electronic package comprising:

a plate of aluminum or aluminum alloy having trenches formed on a major surface thereof, an insulating oxide layer on at least the whole of said major surface of said plate, a network of equipotential electrically conductive connection tracks on said major surface arranged to receive electronic microcomponents, some at least of said tracks overlying said trenches, and a plurality of electronic microcomponents having contacts electrically connected to some at least of said tracks.

2. An electronic package according to claim 1, further comprising at least one recess formed in said major surface and receiving one of said microcomponents.

3. An electronic package according to claim 2, wherein one at least of said microcomponents placed in one said recess has contact tabs outside of the recess for said one microcomponent to contact the plate over an entire surface area thereof that is free from electrical connection tabs.

4. An electronic package according to claim 1, further comprising a protective cover sealingly surrounding the microcomponents and having sides secured to the plate.

5. An electronic package according to claim 1, wherein said plate is formed with projections from a major surface thereof other than the major surface carrying the microcomponents.

6. An electronic package comprising:

a plate of unalloyed or alloyed aluminum, having recesses in the form of trenches or cavities formed on at least one major surface thereof and having an array of through holes, an oxide layer covering at least said major surface including said recesses and a surface of said holes, a network of equipotential electrically conductive connection tracks on said major surface;

electronic microcomponents having contacts fixed to some of the tracks by soldering, some at least of said microcomponents or said tracks being in said recesses; and electrical connection pins passing through the plate, soldered to some at least of said tracks of the network and projecting from a major surface of said plate opposed to said major surface of the plate into electrical connection means fixed to the plate and arranged to receive a mating connector.

7. An electronic package according to claim 6, further comprising a protective cover sealingly surrounding the microcomponents and portions of the pins soldered to some of said tracks and having sides secured to the plate.

8. A method of manufacturing an electronics package comprising the steps of:

making a plate of unalloyed or alloyed aluminum and forming trenches in a major surface thereof;

forming an oxide layer on said major surface of the plate and onto said trenches and forming a network of equipotential connecting tracks on the plate, with at least some of the tracks overlying said trenches; and mounting electronic microcomponents on said oxidized major surface and soldering contacts of the microcomponents to some at least of the tracks.

9. A method according to claim 8, wherein said tracks are so formed that the tracks overlying the trenches are thicker than the other tracks by an amount equal to the depth of said trenches.

\* \* \* \* \*